US008728565B2

(12) United States Patent
Kato et al.

(10) Patent No.: US 8,728,565 B2
(45) Date of Patent: May 20, 2014

(54) METHOD FOR INHIBITING GENERATION OF COPPER SULFIDE

(75) Inventors: Fukutaro Kato, Chiyoda-ku (JP); Eiichi Nagao, Chiyoda-ku (JP); Tsuyoshi Amimoto, Chiyoda-ku (JP); Yoshio Kimura, Chiyoda-ku (JP); Noboru Hosokawa, Chiyoda-ku (JP); Junji Tanimura, Chiyoda-ku (JP); Satoru Toyama, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 13/881,080

(22) PCT Filed: Apr. 8, 2011

(86) PCT No.: PCT/JP2011/058928

§ 371 (c)(1),
(2), (4) Date: Apr. 23, 2013

(87) PCT Pub. No.: WO2012/137350

PCT Pub. Date: Oct. 11, 2012

(65) Prior Publication Data

US 2013/0216698 A1 Aug. 22, 2013

(51) Int. Cl.
*B05D 5/12* (2006.01)
*C23C 16/52* (2006.01)

(52) U.S. Cl.
USPC .................................................. 427/8; 427/58

(58) Field of Classification Search
USPC ........................................................ 427/8, 58
See application file for complete search history.

(56) References Cited

U.S. PATENT DOCUMENTS

| | | | | |
|---|---|---|---|---|
| 8,241,916 | B2 * | 8/2012 | Toyama et al. | 436/120 |
| 2009/0082235 | A1 | 3/2009 | Hilker et al. | |

FOREIGN PATENT DOCUMENTS

| | | | | | |
|---|---|---|---|---|---|
| JP | 06-076635 | | * | 3/1994 | |
| JP | 06076635 | A | * | 3/1994 | H01B 3/20 |
| JP | 2001-311083 | A | | 11/2001 | |
| JP | 2002-015919 | A | | 1/2002 | |
| JP | 2008-544057 | A | | 12/2008 | |
| JP | 2010-027634 | A | | 2/2010 | |
| JP | 2010-028022 | A | | 2/2010 | |
| JP | 06-079936 | | * | 11/2012 | |

OTHER PUBLICATIONS

International Search Report (PCT/ISA/210) issued on Jun. 28, 2011, by the Japanese Patent Office as the International Searching Authority for International Application No. PCT/JP2011/058928.
Decision to Grant Patent issued on Oct. 4, 2011, by the Japanese Patent Office for Application No. 2011-533893.
CIGRE WG A2-32, "Copper sulphide in transformer insulation", Final Report Brochure 378, 2009 (month unknown), pp. 1-35.

(Continued)

*Primary Examiner* — Brian K Talbot
(74) *Attorney, Agent, or Firm* — Buchanan Ingersoll & Rooney PC

(57) ABSTRACT

The present invention provides a method for inhibiting production of copper sulfide in an electrical insulating oil inside an oil-filled electrical apparatus, including adding a benzotriazole compound not having a long-chain alkyl group when the oil-filled electrical apparatus is an open-type oil-filled electrical apparatus, or adding a benzotriazole compound having a long-chain alkyl group when the oil-filled electrical apparatus is a closed-type oil-filled electrical apparatus.

13 Claims, 1 Drawing Sheet

(56) References Cited

OTHER PUBLICATIONS

Scatiggio et al., "Corrosive Sulfur in Insulating Oils: Its Detection and Correlated Power Apparatus Failures", IEEE Transactions Power Delivery, Jan. 2008, pp. 508-509, vol. 23, No. 1.
Toyama et al., "Highly Sensitive Detection Method of Dibenzyl Disulfide and the Elucidation of the Mechanism of Copper Sulfide Generation in Insulating Oil", IEEE Transactions on Dielectrics and Electrical Insulation, Apr. 2009, pp. 509-515, vol. 16, No. 2.
Amimoto et al., "Duration and Mechanism for Suppressive Effect of Triazole-based Passivators on Copper-sulfide Deposition on Insulating Paper", IEEE Transactions on Dielectrics and Electrical Insulation, Feb. 2009, pp. 257-264, vol. 16, No. 1.
Vita et al., "The effect of passivator additive used in transformers and reactors' mineral oil to neutralize the sulphur corrosion, and its influence on low thermal defects", paper A2-215, CIGRE Main Session, 2008 (month unknown), pp. 1-6.

* cited by examiner

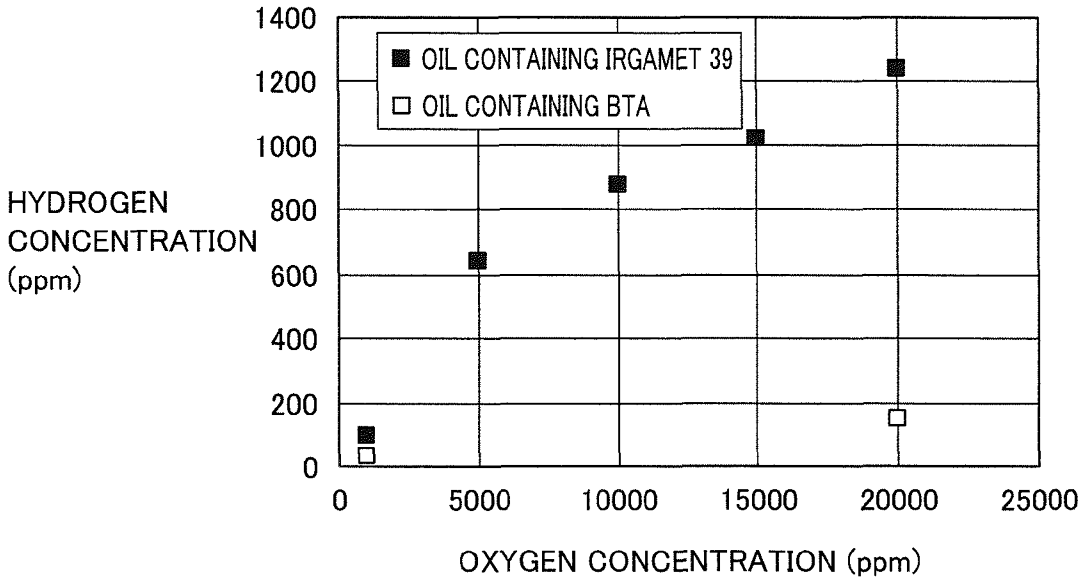
1400
1200
1000
800
600
400
200
0
HYDROGEN CONCENTRATION (ppm)
OIL CONTAINING IRGAMET 39
OIL CONTAINING BTA
0
5000
10000
15000
20000
25000
OXYGEN CONCENTRATION (ppm)

METHOD FOR INHIBITING GENERATION OF COPPER SULFIDE

TECHNICAL FIELD

The present invention relates to a method for inhibiting production of copper sulfide in an electrical insulating oil used for an oil-filled electrical apparatus, such as an oil-filled transformer.

BACKGROUND ART

In an oil-filled electrical apparatus such as an oil-filled transformer, coil copper is used as an energizing medium. This coil is wound with insulating paper, which provides electrical insulation to prevent an electrical short circuit in the coil between neighboring turns.

An insulating oil such as a mineral oil is used in an oil-filled transformer. It is known that a mineral oil or the like contains a small amount of a sulfur component, which reacts with the coil copper placed in the electrical insulating oil to produce electrically conductive copper sulfide on a surface of the coil insulating paper. It is known that such production of copper sulfide causes deteriorated performance of the coil insulating paper, which may lead to a short circuit in the coil between turns and thus, dielectric breakdown (Non-Patent Document 1, for example).

It is also known that the substance mainly responsible for the production of copper sulfide is dibenzyl disulfide, which is a sulfur component contained in a mineral oil (Non-Patent Document 2, for example). The mechanism of production of copper sulfide is known as follows: a complex produced by reaction of dibenzyl disulfide with the coil copper diffuses into the electrical insulating oil and adsorbs to the insulating paper, and then the complex decomposes to produce copper sulfide (Non-Patent Document 3, for example).

Methods for inhibiting production of copper sulfide by inhibiting the reaction between dibenzyl disulfide and the coil copper based on the above-described production mechanism are known, among which a method wherein an inhibitor is added to an electrical insulating oil is widely used. Examples of known inhibitors include benzotriazole compounds (Non-Patent Document 4, for example) such as 1,2,3-benzotriazole (hereinafter abbreviated to "BTA") and Irgamet (registered trademark) 39 [N,N-bis(2-ethylhexyl)-(4 or 5)-methyl-1H-benzotriazole-1-methylamine, manufactured by BASF Japan, Inc.].

When an inhibitor for the production of copper sulfide is added to an electrical insulating oil, the inhibitor reacts with the coil copper to form a film on the surface of the coil copper. The formed film serves to block or inhibit the reaction between dibenzyl disulfide and the coil copper, thereby inhibiting the production of copper sulfide (Non-Patent Document 4, for example).

Since Irgamet 39 has a lipophilic long-chain alkyl group, it has high solubility in an electrical insulating oil as compared to BTA, and can be dissolved in an electrical insulating oil without using a special dissolving apparatus needed for the operation of adding BTA (Patent Documents 1 and 2, for example). Therefore, the addition of Irgamet 39 to an existing transformer simplifies the on-site work, leading to a shorter power-outage time on site. Thus, the needs for application of Irgamet 39 are increasing.

The addition of Irgamet 39 to a transformer, however, has a problem in that a large amount of hydrogen gas is produced (Non-Patent Documents 4 and 5, for example). Moreover, because hydrogen gas is a gas component that serves as an index of discharge at the time of an internal abnormality diagnosis of the transformer, if hydrogen gas is produced by the addition of Irgamet 39, a correct diagnosis of an internal abnormality in the transformer cannot be made.

CITATION LIST

Patent Document

PTD 1: Japanese Patent Laying-Open No. 2010-28022
PTD 2: Japanese Patent Laying-Open No. 2002-15919

Non Patent Document

NPD 1: CIGRE WG A2-32, "Copper sulphide in transformer insulation," Final Report Brochure 378, 2009

NPD 2: F. Scatiggio, V. Tumiatti, R. Maim, M. Tumiatti, M. Pompilli and R. Bartnikas, "Corrosive Sulfur in Insulating Oils: Its Detection and Correlated Power Apparatus Failures", IEEE Trans. Power Del., Vol. 23, pp. 508-509, 2008

NPD 3: S. Toyama, J. Tanimura, N. Yamada, E. Nagao and T. Amimoto, "Highly Sensitive Detection Method of Dibenzyl Disulfide and the Elucidation of the Mechanism of Copper Sulfide Generation in Insulating Oil", IEEE Transactions on Dielectrics and Electrical Insulation, Vol. 16, No. 2, pp. 509-515, 2009.

NPD 4: T. Amimoto, E. Nagao, J. Tanimura, S. Toyama and N. Yamada, "Duration and Mechanism for Suppressive Effect of Triazole-based Passivators on Copper-sulfide Deposition on Insulating Paper", IEEE Transactions on Dielectrics and Electrical Insulation, Vol. 16, No. 1, pp. 257-264, 2009.

NPD 5: Andre Vita, Paulo R. T. Patrocinio, Sergio A. Godinho, Edilson G. Peres, Joao Baudalf, "The effect of passivator additive used in transformers and reactors' mineral oil to neutralize the sulphur corrosion, and its influence on low thermal defects", paper A2-215, CIGRE Main Session, 2008, Paris.

SUMMARY OF INVENTION

Technical Problem

An object of the present invention is to provide a method for inhibiting production of copper sulfide that can prevent generation of hydrogen gas after the addition of an inhibitor for production of copper sulfide into an electrical insulating oil, and can be performed in a manner that is as simple as possible.

Solution to Problem

The present invention relates to a method for inhibiting production of copper sulfide in an electrical insulating oil inside an oil-filled electrical apparatus, including:

adding a benzotriazole compound not having a long-chain alkyl group when the oil-filled electrical apparatus is an open-type oil-filled electrical apparatus; or adding a benzotriazole compound having a long-chain alkyl group when the oil-filled electrical apparatus is a closed-type oil-filled electrical apparatus.

The benzotriazole compound having a long-chain alkyl group is preferably N,N-bis(2-ethylhexyl)-(4 or 5)-methyl-1H-benzotriazole-1-methylamine.

The oil-filled electrical apparatus is preferably a large transformer.

The present invention also relates to a method for inhibiting production of copper sulfide in an electrical insulating oil inside an oil-filled electrical apparatus, including:

measuring in advance an oxygen concentration in the electrical insulating oil inside the oil-filled electrical apparatus;

adding a benzotriazole compound having a long-chain alkyl group when a measured value of the oxygen concentration is lower than 5000 ppm; or adding a benzotriazole compound not having a long-chain alkyl group when the measured value of the oxygen concentration is not lower than 5000 ppm.

Advantageous Effects of Invention

In accordance with the present invention, a method for inhibiting production of copper sulfide is provided which can prevent generation of hydrogen gas after the addition of an inhibitor for production of copper sulfide into an electrical insulating oil, and which can be performed in a manner that is as simple as possible, by selecting the kind of the inhibitor in accordance with the type of the oil-filled electrical apparatus.

BRIEF DESCRIPTION OF DRAWING

FIG. 1 is a graph showing results of a heating test in Test Example 1.

DESCRIPTION OF EMBODIMENTS

First Embodiment

This embodiment relates to a method for inhibiting production of copper sulfide in an electrical insulating oil inside an oil-filled electrical apparatus, wherein the kind of inhibitor for production of copper sulfide is selected depending on whether the oil-filled electrical apparatus is of an open-type or a closed-type, and the selected inhibitor is added to the electrical insulating oil.

The oil-filled electrical apparatus is an electrical apparatus containing an oil such as an electrical insulating oil, and may, for example, be a transformer in which an electrical insulating oil is sealed. An open-type oil-filled electrical apparatus is an oil-filled electrical apparatus that is not closed, and a closed-type oil-filled electrical apparatus is an oil-filled electrical apparatus that is closed. The oil-filled electrical apparatus is preferably a transformer, and more preferably a large transformer. Particularly when hydrogen gas is produced in a large transformer, costs are required for disassembling, inspection, and the like, during which time supply of electric power may be stopped. It is thus highly necessary to prevent generation of hydrogen gas.

The benzotriazole compound is a compound having the benzotriazole skeleton. In the present invention, a benzotriazole compound not having a long-chain alkyl group or a benzotriazole compound having a long-chain alkyl group is used depending on the type of the oil-filled electrical apparatus. The long-chain alkyl herein is preferably an alkyl group having one or more carbon atoms, and more preferably an alkyl group having 1 to 8 carbon atoms.

Examples of the benzotriazole compound not having a long-chain alkyl group include 1,2,3-benzotriazole (BTA), and commercially available C. V. I. (registered trademark), manufactured by Chelest Corporation, can be used, for example.

Examples of the benzotriazole compound having a long-chain alkyl group include N,N-bis(2-ethylhexyl)-(4 or 5)-methyl-1H-benzotriazole-1-methylamine, and commercially available Irgamet 39, manufactured by BSAF Inc., can be used, for example.

Second Embodiment

This embodiment relates to a method for inhibiting production of copper sulfide in an electrical insulating oil inside an oil-filled electrical apparatus, wherein an oxygen concentration in the electrical insulating oil inside the oil-filled electrical apparatus is measured, the kind of inhibitor for production of copper sulfide is selected depending on whether a measured value of the oxygen concentration is less than a predetermined reference value or not less than the reference value, and the selected inhibitor is added to the electrical insulating oil.

Specifically, the oxygen concentration in the electrical insulating oil inside the oil-filled electrical apparatus is actually measured. In the case of using Irgamet 39, the reference value is set to 5000 ppm, which is an oxygen concentration at which an influence of oxygen upon generation of hydrogen gas abruptly increases. When the oxygen concentration is lower than this reference value, the benzotriazole compound having a long-chain alkyl group is added. When the oxygen concentration is not lower than this reference value, the benzotriazole compound not having a long-chain alkyl group is added. In accordance with this embodiment, generation of hydrogen can be prevented more reliably while allowing the production of copper sulfide to be inhibited in a simple manner.

Test Example 1

In order to examine an influence of a state of contact between an electrical insulating oil and oxygen, electrical insulating oils having different oxygen concentrations were used, and an amount of generated hydrogen gas was examined after adding an inhibitor for production of copper sulfide to each of the electrical insulating oils. Specifically, polished copper wire, the inhibitor for production of copper sulfide, and each of the electrical insulating oils having different oxygen concentrations were placed in a closed test container. A heating test was then conducted in a hot air circulating dryer, and a hydrogen gas concentration in the closed test container after the heating test was measured.

A paraffinic mineral oil (fresh oil) for use in an oil-filled transformer was used as an electrical insulating oil. The oil was subjected to degassing treatment in advance, and prepared as an oil whose concentration of inflammable gases such as hydrogen gas had been kept sufficiently low. The oxygen concentration (initial value) in this electrical insulating oil was not more than 1000 ppm. Electrical insulating oils having oxygen concentrations (initial values) of 5000 ppm, 10000 ppm, 15000 ppm, and 20000 ppm were also prepared. Each of the electrical insulating oils having the various oxygen concentrations was prepared after the degassing treatment, by monitoring the oxygen concentration in the electrical insulating oil while bubbling a predetermined amount of air therethrough, and stopping the bubbling when the oxygen concentration had reached each of the above-mentioned respective oxygen concentrations (5000 ppm, 10000 ppm, 15000 ppm, or 20000 ppm).

As the closed test container, a bellows-type stainless steel container was used which could block outside air from flowing in, and accommodate expansion of each electrical insulating oil due to heating. The copper wire was placed together in order to simulate coil copper in a transformer. Irgamet 39

(manufactured by BSAF, Inc.) or BTA (C. V. I. (registered trademark), manufactured by Chelest Corporation) was used as the inhibitor for production of copper sulfide.

The heating test was conducted for a heating time of 24 hours at a heating temperature of 120° C. The hydrogen concentration in the electrical insulating oil after the heating test was measured by gas chromatography.

FIG. 1 shows a relation between the oxygen concentration (initial value) in each of the electrical insulating oils and the hydrogen concentration in the electrical insulating oil after the heating test. In the case of adding Irgamet 39, large amounts of hydrogen gas were generated in the electrical insulating oils having oxygen concentrations of 5000 to 20000 ppm, whereas only a small amount of hydrogen gas was generated in the electrical insulating oil having an oxygen concentration of not more than 1000 ppm. In other words, it was revealed that when Irgamet 39 was added to an electrical insulating oil, the oxygen concentration in the electrical insulating oil significantly affected the amount of generation of hydrogen gas. In the case of adding BTA, on the other hand, it was revealed that the amount of generation of hydrogen gas was small, irrespective of the oxygen concentration in the electrical insulating oil.

Moreover, as shown in FIG. 1, it is observed that in the case of using Irgamet 39, the influence of oxygen upon generation of hydrogen gas abruptly increases between 1000 ppm and 5000 ppm.

Transformers can roughly be classified into an open-type transformer and a closed-type transformer. In each type of transformer, a small tank for the purpose of preventing oxidative degradation of an electrical insulating oil, which is referred to as a conservator, is provided in an upper portion within a main body tank. A closed-type conservator is provided with a rubber bag for suppressing contact between air and the electrical insulating oil, thereby suppressing dissolution of oxygen into the electrical insulating oil. An open-type conservator, on the other hand, is not provided with a rubber bag as in the closed-type conservator, and performs breathing through a moisture absorbing respirator containing a moisture absorbing material such as silica gel. Oxygen thus easily dissolves into the electrical insulating oil, as compared to the closed-type transformer.

As described above, in an electrical insulating oil containing BTA, the amount of hydrogen gas is small, irrespective of the oxygen concentration. By adding BTA into an oil-filled electrical apparatus, therefore, the reliability of the oil-filled electrical apparatus can be maintained. However, since BTA has low solubility in an electrical insulating oil, a special dissolving apparatus is required, and the need for an on-site operation arises, which may lengthen the power outage time. Thus, in order to ensure that generation of hydrogen is prevented, it is preferred to add a benzotriazole compound having a long-chain alkyl group (e.g., Irgamet 39) that can be added in a simple manner to a closed-type oil-filled electrical apparatus in which the oxygen concentration in an electrical insulating oil is generally low, and it is preferred to add a benzotriazole compound not having a long-chain alkyl group (e.g., BTA) to an open-type oil-filled electrical apparatus in which the oxygen concentration in an electrical insulating oil may be high.

Even in a closed-type oil-filled electrical apparatus, a small amount of oxygen may permeate through an electrical insulating oil. Conversely, even in an open-type oil-filled electrical apparatus, almost no oxygen may be dissolved in an electrical insulating oil, depending on the ambient atmosphere, operating conditions, and the like. Therefore, the oxygen concentration in the electrical insulating oil inside the oil-filled electrical apparatus is actually measured. In the case of using Irgamet 39, the reference value is set to 5000 ppm, which is an oxygen concentration at which the influence of oxygen upon generation of hydrogen gas abruptly increases. When the oxygen concentration is lower than this reference value, a benzotriazole compound having a long-chain alkyl group (e.g., Irgamet 39) is added, and when the oxygen concentration is not lower than this reference value, a benzotriazole compound not having a long-chain alkyl group (e.g., BTA) is added. In this way, the generation of hydrogen can be prevented more reliably while allowing the production of copper sulfide to be inhibited in a simple manner.

While the foregoing describes the case where the present invention is applied to an oil-filled transformer, the present invention can also be used in other oil-filled electrical apparatuses in which electrical insulating oils are used as insulating media.

It should be understood that the embodiments disclosed herein are illustrative and non-restrictive in every respect. The scope of the present invention is defined by the terms of the claims, rather than by the foregoing description, and is intended to include any modifications within the scope and meaning equivalent to the terms of the claims.

The invention claimed is:

1. A method for inhibiting production of copper sulfide in an electrical insulating oil inside an oil-filled electrical apparatus, comprising:

classifying the oil-filled electrical apparatus as an open-type oil-filled electrical apparatus or a closed-type oil-filled electrical apparatus;

adding a benzotriazole compound not having a long-chain alkyl group when said oil-filled electrical apparatus is classified as an open-type oil-filled electrical apparatus; and adding a benzotriazole compound having a long-chain alkyl group when said oil-filled electrical apparatus is classified as a closed-type oil-filled electrical apparatus.

2. The method for inhibiting production of copper sulfide according to claim 1, wherein said benzotriazole compound having a long-chain alkyl group is N,N-bis(2-ethylhexyl)-(4 or 5)-methyl-1H-benzotriazole-1-methylamine.

3. The method for inhibiting production of copper sulfide according to claim 1, wherein said oil-filled electrical apparatus is a transformer.

4. A method for inhibiting production of copper sulfide in an electrical insulating oil inside an oil-filled electrical apparatus, comprising:

measuring in advance an oxygen concentration in said electrical insulating oil inside said oil-filled electrical apparatus; and adding a benzotriazole compound having a long-chain alkyl group when a measured value of the oxygen concentration is lower than 5000 ppm; or adding a benzotriazole compound not having a long-chain alkyl group when the measured value of the oxygen concentration is not lower than 5000 ppm.

5. The method for inhibiting production of copper sulfide according to claim 1, wherein said benzotriazole compound not having a long-chain alkyl group is 1,2,3-benzotriazole.

6. The method for inhibiting production of copper sulfide according to claim 4, wherein said electrical apparatus is an open-type electrical apparatus or a closed-type electrical apparatus.

7. The method for inhibiting production of copper sulfide according to claim 1, wherein said long-chain alkyl group of said benzotriazole compound having a long-chain alkyl group comprises 1 to 8 carbon atoms.

8. The method for inhibiting production of copper sulfide according to claim 1, wherein said electrical insulating oil is a paraffinic mineral oil.

9. The method for inhibiting production of copper sulfide according to claim 4, wherein said benzotriazole compound having a long-chain alkyl group is N,N-bis(2-ethylhexyl)-(4 or 5)-methyl-1H-benzotriazole-1-methylamine.

10. The method for inhibiting production of copper sulfide according to claim 4, wherein said oil-filled electrical apparatus is a transformer.

11. The method for inhibiting production of copper sulfide according to claim 4, wherein said benzotriazole compound not having a long-chain alkyl group is 1,2,3-benzotriazole.

12. The method for inhibiting production of copper sulfide according to claim 4, wherein said electrical insulating oil is a paraffinic mineral oil.

13. The method for inhibiting production of copper sulfide according to claim 4, wherein said long-chain alkyl group of said benzotriazole compound having a long-chain alkyl group comprises 1 to 8 carbon atoms.

* * * * *